United States Patent
Cheong et al.

(10) Patent No.: US 6,812,111 B2
(45) Date of Patent: Nov. 2, 2004

(54) METHODS FOR FABRICATING MOS TRANSISTORS WITH NOTCHED GATE ELECTRODES

(75) Inventors: Kong-Soo Cheong, Seoul (KR); Hee-Sung Kang, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 10/292,340

(22) Filed: Nov. 12, 2002

(65) Prior Publication Data

US 2003/0143791 A1 Jul. 31, 2003

(30) Foreign Application Priority Data

Jan. 29, 2002 (KR) ........................................ 2002-05052

(51) Int. Cl.[7] .............................................. H01L 21/20
(52) U.S. Cl. ...................... 438/396; 438/259; 438/199; 438/201; 438/202; 438/221; 438/299; 438/303; 438/304; 257/69; 257/204
(58) Field of Search ................................ 438/396, 259, 438/199–230, 299, 303–304, 364, 692; 257/69, 204

(56) References Cited

U.S. PATENT DOCUMENTS

| | | | | |
|---|---|---|---|---|
| 5,960,270 A | * | 9/1999 | Misra et al. ................ | 438/197 |
| 6,204,133 B1 | * | 3/2001 | Yu et al. ...................... | 438/299 |
| 6,307,230 B1 | * | 10/2001 | Chatterjee et al. .......... | 257/327 |
| 6,395,589 B1 | * | 5/2002 | Yu .............................. | 438/183 |
| 6,399,469 B1 | * | 6/2002 | Yu .............................. | 438/595 |
| 6,461,904 B1 | * | 10/2002 | Jin et al. ..................... | 438/182 |
| 6,541,320 B2 | * | 4/2003 | Brown et al. ................ | 438/197 |
| 6,566,198 B2 | * | 5/2003 | Park et al. ................... | 438/259 |
| 6,713,333 B2 | * | 3/2004 | Mayuzumi ................... | 438/197 |
| 2002/0155665 A1 | * | 10/2002 | Doris et al. .................. | 438/279 |
| 2003/0082861 A1 | * | 5/2003 | Mayuzumi ................... | 438/197 |
| 2003/0228766 A1 | * | 12/2003 | Chou et al. .................. | 438/694 |

OTHER PUBLICATIONS

Pidin et al. "A notched metal gate mosfet for sub–0.1 um operation" Electron Devices Meeting, 2000. IEDM Technical Digest. International, Dec. 10–13, 2000 p. 659–662.*

* cited by examiner

Primary Examiner—Matthew Smith
Assistant Examiner—Granvill David Lee, Jr.
(74) Attorney, Agent, or Firm—Mills & Onello LLP

(57) ABSTRACT

In methods for fabricating MOS transistors with notched gate electrodes, a notched gate electrode may be readily fabricated using a damascene process for filling a stair-shaped opening formed in a multi-layered insulation layer. In this manner, the width and a height of the notch region of the gate electrode may be readily adjusted and controlled.

30 Claims, 8 Drawing Sheets

METHODS FOR FABRICATING MOS TRANSISTORS WITH NOTCHED GATE ELECTRODES

RELATED APPLICATION

This application relies for priority upon Korean Patent Application No. 2002-05052, filed on Jan. 29, 2002, the contents of which are herein incorporated by reference in their entirety.

1. Field of the Invention

The present invention relates to methods for fabricating semiconductor devices and, more particularly, to methods for fabricating MOS transistors with notched gate electrodes.

2. Background of the Invention

As semiconductor devices become increasingly integrated, the area occupied by MOS transistors on integrated circuits has been gradually reduced. As the channel length of a MOS transistor decreases, there may arise a short channel effect (SCE), which seriously deteriorates the characteristics of the transistor. The SCE is caused by the phenomena of drain-induced barrier lowering (DIBL), punchthrough, hot carriers, and the like.

As the space between a source and drain decreases, electrons emitted from the source are sharply accelerated due to a high electric field in the vicinity of the edge of the drain junction region, which generates hot carriers, in turn causing characteristics of semiconductor devices to be degraded. The foregoing phenomenon is typically referred as the hot carrier effect. For this reason, MOS transistors of lightly doped drain (LDD) structures have been extensively used to improve degradation caused by the hot carriers.

Figure 1:
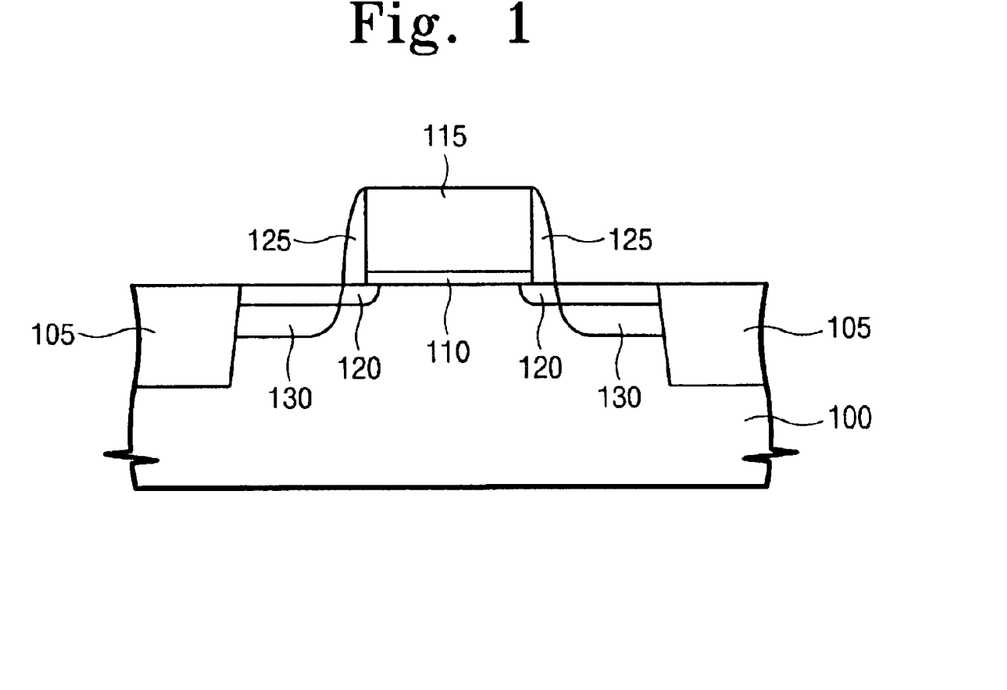
FIG. 1 is a cross-sectional view of a MOS transistor of a conventional LDD structure.

FIG. 1 is a cross-sectional view of a MOS transistor of a conventional LDD structure.

Referring to FIG. 1, a device isolation layer 105 is formed in a semiconductor substrate 100 to define an active region. A gate stack, which includes a gate insulation layer 110, a gate electrode 115, and a gate spacer 125, is formed on the active region. A lightly doped impurity region 120 and a heavily doped impurity region 130 are formed in the semiconductor substrate of both edges of the gate insulation layer 110. The lightly doped and heavily doped impurity regions 120 and 130 correspond to source and drain regions.

In the LDD structure, the lightly doped impurity region 120 self-aligned to the gate electrode 115 is disposed between a channel region and the heavily doped impurity region 130. The lightly doped impurity region 120 allows an electric field between the drain and channel regions to be reduced such that, even if a high voltage is applied to the drain region, carriers emitted from the source region are not sharply accelerated. As a result, adverse effects due to the hot carrier effect can be mitigated.

However, since parasitic capacitance, which is exhibited in the overlapped region of the gate electrode and the LDD region, reduces speed of devices, the LDD structure makes it difficult to realize a MOS transistor suitable for high-speed operation. To improve performance lowered by the LDD structure, MOS transistors with notched gate electrodes have been recently proposed.

Figure 2:
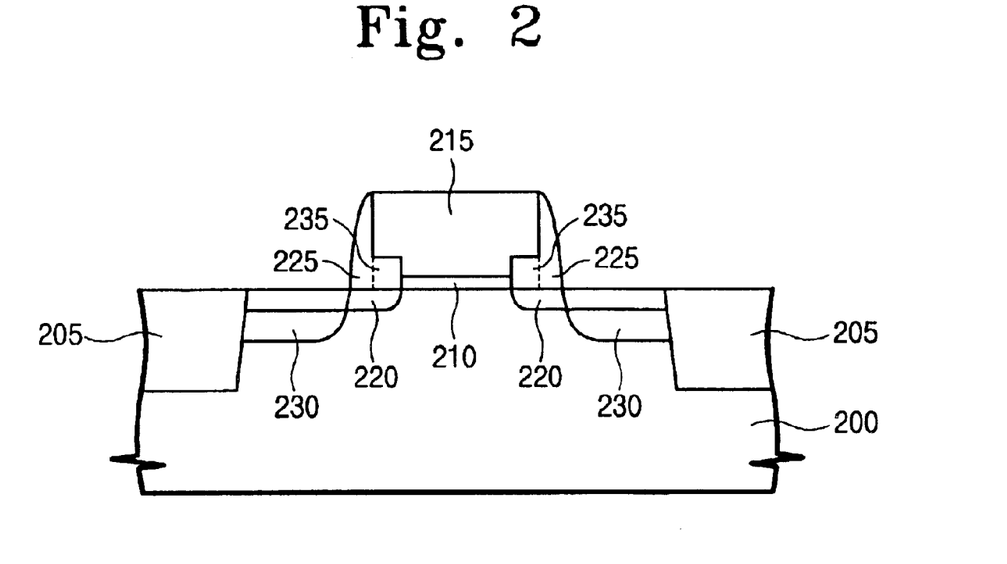
FIG. 2 is a cross-sectional view of a MOS transistor with a conventional notched gate electrode.

FIG. 2 is a cross-sectional view of a MOS transistor with a notched gate electrode.

Referring to FIG. 2, a device isolation layer 205 is formed at a semiconductor substrate 200 to define an active region. A gate stack, which includes a gate insulation layer 210, a notched gate electrode 215, and a gate spacer 225, is formed on the active region. A lightly doped impurity region 220 and a heavily doped impurity region 230 are formed in the semiconductor substrate of both edges of the gate insulation layer 210. The lightly doped and heavily doped impurity regions 220 and 230 correspond to source and drain regions.

One of advantages of the notched gate electrode is that the channel length is substantially reduced by a notch region 235 formed under the gate electrode. This results in reduction of overlap capacitance between the gate and the source and between the gate and the drain. Therefore, transistors may be improved in their performance and speed.

In addition, since halo implantation is the technique used for ion implantation in the substrate including a notched gate electrode, this makes it possible to form a relatively deeper ion implantation region, as compared with a conventional gate electrode. Halo implantation is thus more effective in stopping punchthrough. According to halo implantation, the notch region 235 under the edge of the gate electrode does not inhibit the ion implantation.

Finally, the notched gate electrode is a T-shaped gate, the lower portion of which may have a shorter length than the upper portion. This permits silicide to be widely formed on the upper portion of the gate electrode, thus enabling lower resistance.

A conventional method for fabricating a notched gate electrode comprises patterning a gate electrode using photolithographic and etching processes through a specific etching method in order to form a notch region under an edge of the gate electrode. For example, after forming a gate conductive layer having a stacked structure of silicon germanium and polysilicon, an etching process is performed using a difference in etch rate to form the notched gate electrode. That is, the notched gate electrode is formed using the difference in etch rate between silicon germanium and polysilicon.

The problem of the conventional method is that it is difficult to realize the notch region at a desired size. In other words, a gate electrode cannot be readily formed to a desired length. In addition, in the dry etching process for forming the gate electrode, a plasma gas may transform the gate electrode and cause an electric charge to be generated in the gate electrode. This may lead to partial concentration of an electric field or a trap charge, thus lowering reliability of the gate insulation layer.

SUMMARY OF THE INVENTION

In addressing the aforementioned limitations, the present invention provides methods for fabricating MOS transistors with notched gate electrodes, which can form a gate pattern without the need for etching the gate conductive layer and, in this manner, provides enhanced control over the resulting width and a height of the notch region.

In accordance with broad aspects of the present invention, provided is a method for fabricating a MOS transistor with a notched gate electrode that comprises forming a multi-layered insulation layer including at least two insulation layers on a substrate. The multi-layered insulation layer is patterned to form an opening exposing a predetermined region of the substrate. The opening has a stair-shaped sidewall such that an upper portion of the opening is wider than a lower portion thereof. A gate insulation layer is then formed on the exposed substrate, and a gate electrode is formed on the insulation layer to fill the stair-shaped opening. The multi-layered insulation layer is then removed. As a result, a notched gate electrode, in which a notch region is formed under an edge of the gate electrode, is formed.

Forming the opening having the stair-shaped sidewall comprises forming upper and lower openings. After forming a multi-layered insulation layer including lower and upper molding layers, the upper molding layer is etched by using a mask pattern to form the upper opening. A self-aligned spacer is then formed on a side of the upper opening. By using the self-aligned spacer as an etch mask, the lower molding layer is etched to form the lower opening. This results in formation of the opening with a stair-shaped sidewall in which the upper opening is wider than the lower opening.

Another method for forming the opening with a stair-shaped sidewall employs photolithographic and etching processes twice. In other words, after forming a multi-layered insulation layer, which includes lower and upper molding layers, the photolithography and etching are performed into the upper molding layer by using a first mask pattern to form an upper opening. Thereafter, the lower molding layer is etched using a second mask pattern so as to form the opening with a stair-shaped sidewall in which the upper opening is wider than the lower opening.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The present invention will now be described more fully hereinafter with reference to the accompanying drawings, in which preferred embodiments of the invention are shown.

Embodiment 1

FIGS. 3A to 3L are cross-sectional views for illustrating a method for fabricating a MOS transistor according to a first preferred embodiment of the present invention.

Figure 3A:
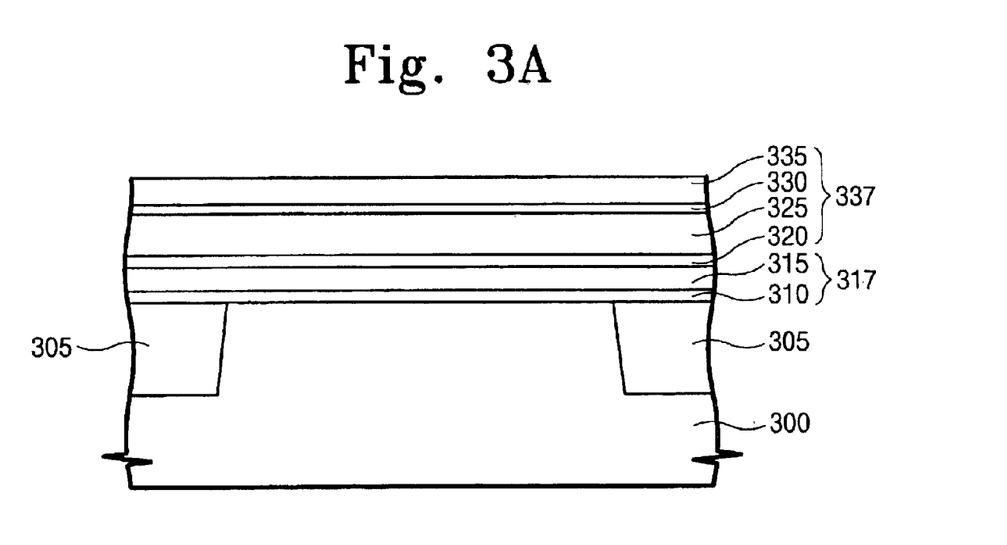
FIGS. 3A to 3L are cross-sectional views for illustrating a method for fabricating a MOS transistor according to a first preferred embodiment of the present invention.

Referring to FIG. 3A, a device isolation layer 305 is formed at a substrate 300 to define an active region. Lower and upper molding layers 317 and 337 are then formed on the substrate 300. The lower molding layer 317 may include a sacrificial insulation layer 310 and a lower insulation layer 315. The upper molding layer 337 may include an etch stop layer 320, an upper insulation layer 325, a polishing stop layer 330, and a capping insulation layer 335.

To form the sacrificial insulation layer 310, thermal oxidation or CVD method is carried out into a silicon substrate such that a thin silicon oxide layer is formed on the substrate.

The lower insulation layer 315 may comprise, for example, a silicon oxide layer and is formed to have a thickness ranging from 50 to 1000 Å. The upper insulation layer 325 may comprise, for example, a silicon oxide layer and is formed to have a thickness ranging from 500 to 3000 Å. The lower and upper insulation layers 315 and 325 may be formed, for example, using plasma enhanced CVD (PECVD), high density plasma CVD (HDP-CVD), atmosphere pressure CVD (APCVD), or a spin coating technique.

The etch stop layer 320 may comprise, for example, a silicon nitride layer.

The polishing stop layer 330 is formed to stop polishing during a subsequent chemical mechanical polishing (CMP) procedure, and may comprise, for example, a silicon nitride layer.

The capping insulation layer 335 is formed to protect the polishing stop layer 330 during a subsequent etchback process and is composed of a material having an etch selectivity with respect to the polishing stop layer 330, for example, a silicon oxide layer.

Figure 3B:
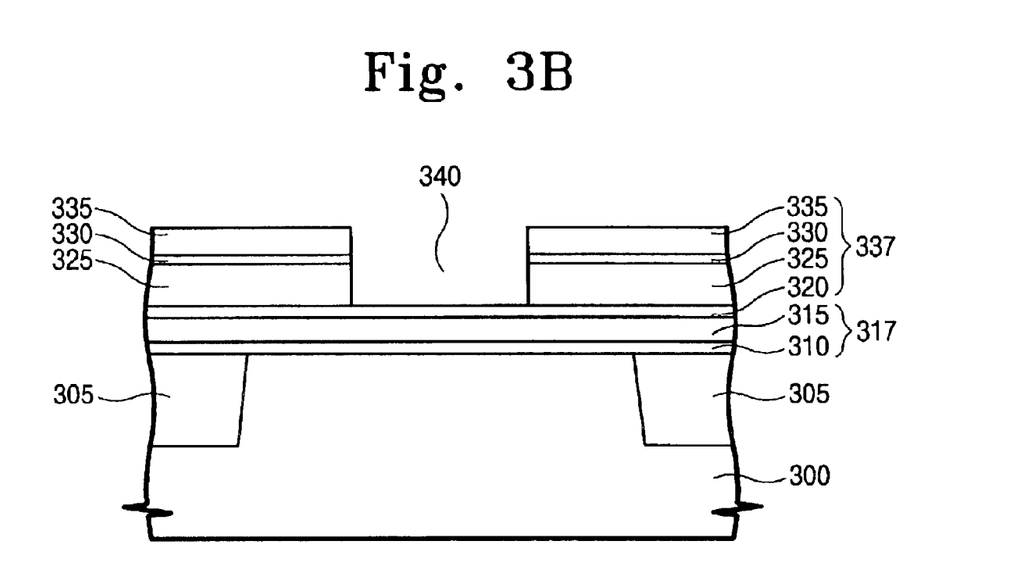

Referring to FIG. 3B, the capping insulation layer 335, the polishing stop layer 330, and the upper insulation layer 325 are selectively etched using a mask pattern until the etch stop layer 320 is exposed. Thus, an upper opening 340 is formed.

Figure 3C:
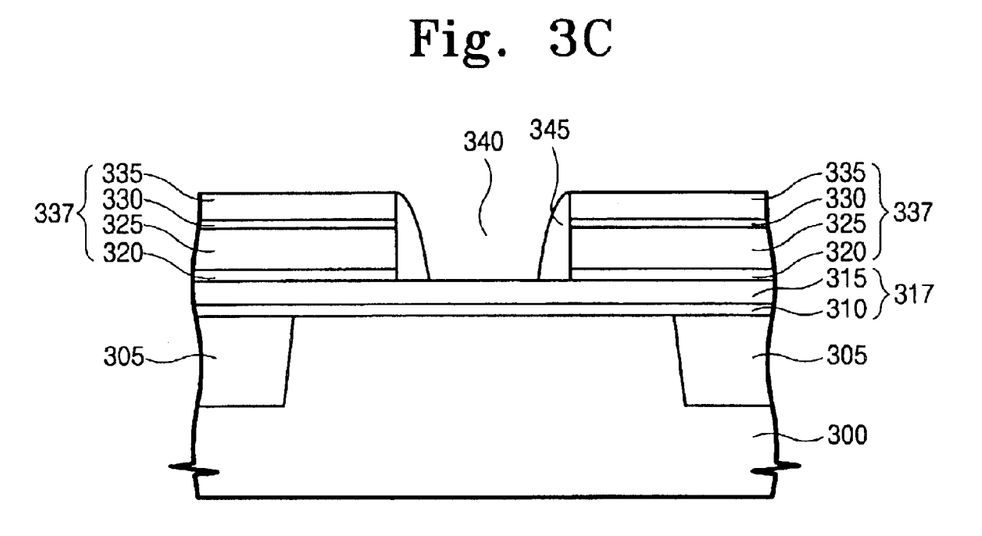

Referring to FIG. 3C, a spacer insulation layer is formed on an entire surface of the substrate including the upper opening 340. An etchback process is carried out on the entire surface of the resultant substrate, thereby forming a self-aligned spacer 345 on a side of the upper opening 340. The spacer insulation layer may comprise, for example, a silicon nitride layer, and is formed to have a thickness ranging from 5 to 500 Å. Since the spacer insulation layer and the etch stop layer 320 alike are silicon nitride layers, while forming the self-aligned spacer 345, the etch stop layer 320 is likewise etched during this step to expose the lower insulation layer 315. If the capping insulation layer 335 is not formed, the polishing stop layer 330, which does not have an etch selectivity with respect to the spacer insulation layer, may be removed during the foregoing etchback process. The capping insulation layer 335 thus protects the polishing stop layer 330.

Figure 3D:
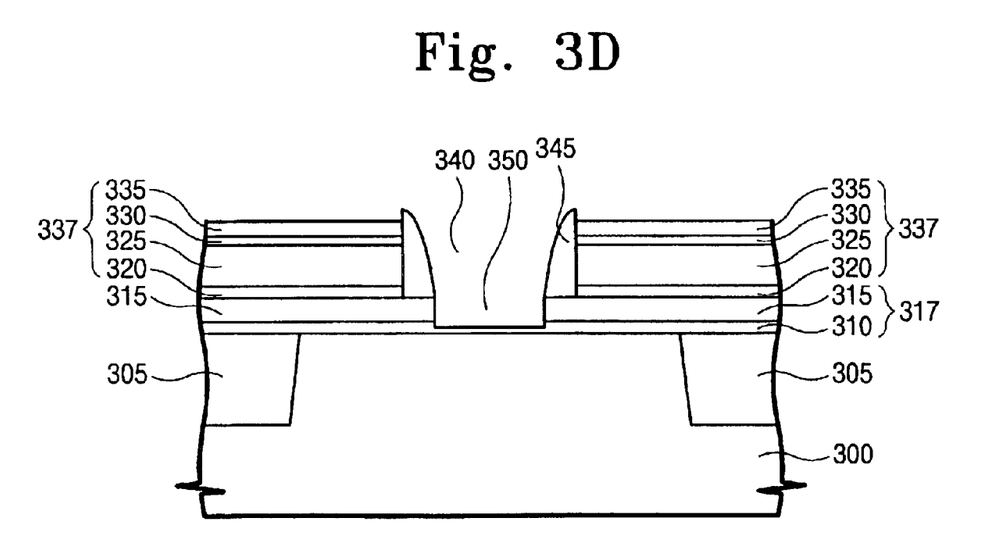

Referring to FIG. 3D, by using the self-aligned spacer 345 as an etch mask, a dry etching process is performed into the lower insulation layer 315 using plasma to form a lower opening 350 exposing the sacrificial insulation layer 310. When the lower insulation layer 315 is etched, the capping insulation layer 335 is partially removed. The width of the lower opening 350 may be adjusted according to the width of the self-aligned spacer 345. Since the lower insulation layer 315 and the sacrificial insulation layer 310, both of which are oxide layers, do not have etch selectivity with respect to each other, the etching time should be adjusted so as not to expose the substrate. In FIG. 3D, the sacrificial insulation layer 310 is illustrated as being over-etched.

Figure 3E:
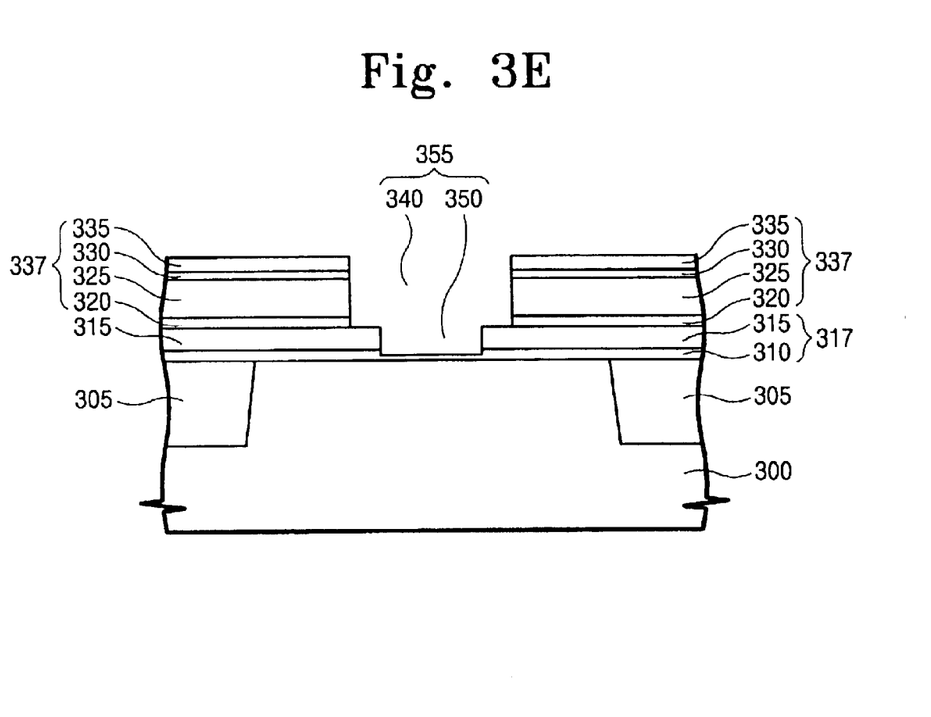

Referring to FIG. 3E, the self-aligned spacer 345 is removed to form a stair-shaped opening 355 consisting of upper and lower openings 340 and 350. The upper portion 340 of the stair-shaped opening 355 is wider than the lower portion 350. In the present preferred embodiment, to form the stair-shaped opening, while the upper opening 340 is formed using photolithographic and etching processes, the lower opening 350 is formed by an etching process using the self-aligned spacer 345 as a mask. In the case of using the spacer 345 as a mask, the lower opening may be effectively formed at level of precision that is to be narrower than the critical dimension (CD) of the process.

Figure 3F:
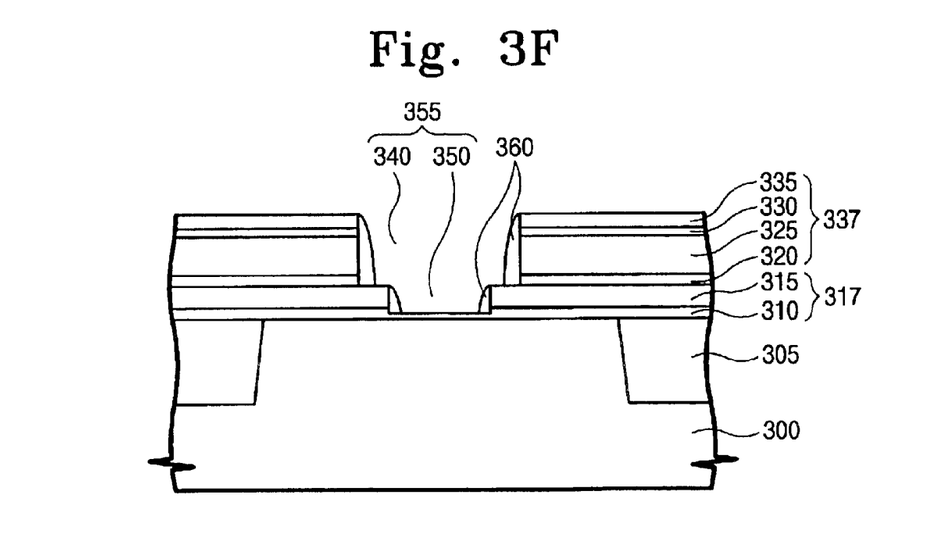

Referring to FIG. 3F, a protecting spacer insulation layer may be thinly formed on an entire surface of the substrate.

An etchback process may be then performed to form a protecting spacer 360 on the side portions of the stair-shaped opening 355. The protecting spacer insulation layer may comprise, for example, a silicon nitride layer, and is formed to have a thickness ranging from 5 to 500 Å.

Figure 3G:
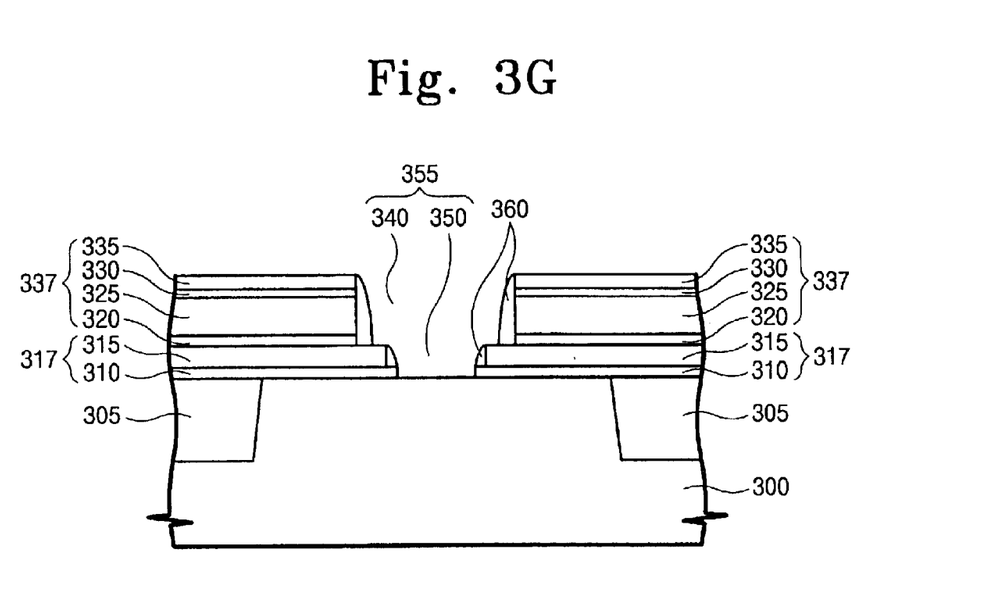

Referring to FIG. 3G, the sacrificial insulation layer 310 under the stair-shaped opening 355 is removed by a cleaning process to expose the substrate 300. At this time, the protecting spacer 360, which is formed on the side of the stair-shaped opening 355, protects the side surfaces of the upper and lower insulation layers 315 and 325, thereby preventing the stair-shaped opening 355 from becoming larger.

Figure 3H:
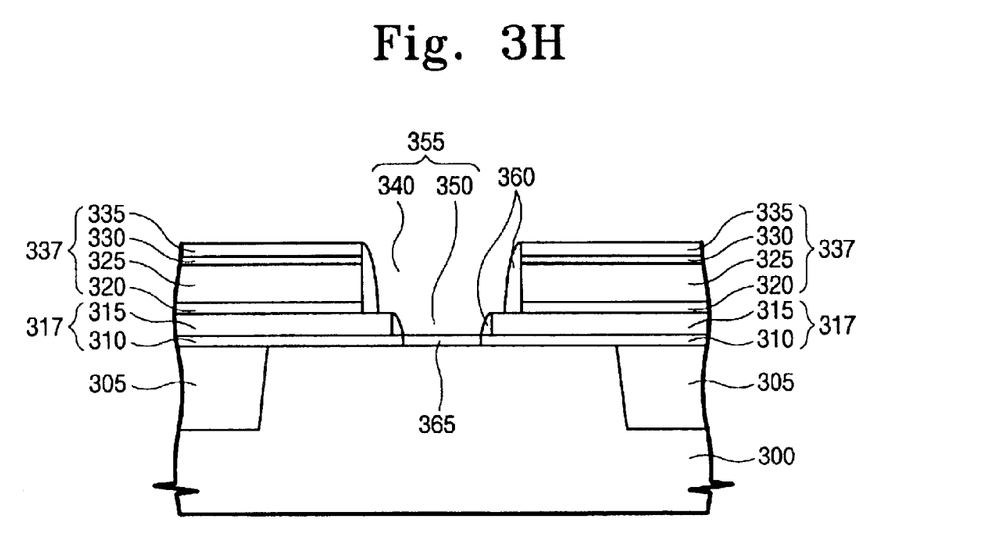

Referring to FIG. 3H, a gate insulation layer 365 is formed on the exposed substrate 300. The gate insulation layer 365 may comprise at least one layer type selected from the group consisting of a silicon oxide layer, a silicon nitride layer, a silicon oxynitride layer, a zirconium oxide layer, a hafnium oxide layer, a tantalum pentaoxide layer, and an aluminum oxide layer. The gate insulation layer 365 has a thickness, for example, of 10 to 200 Å.

Figure 3I:
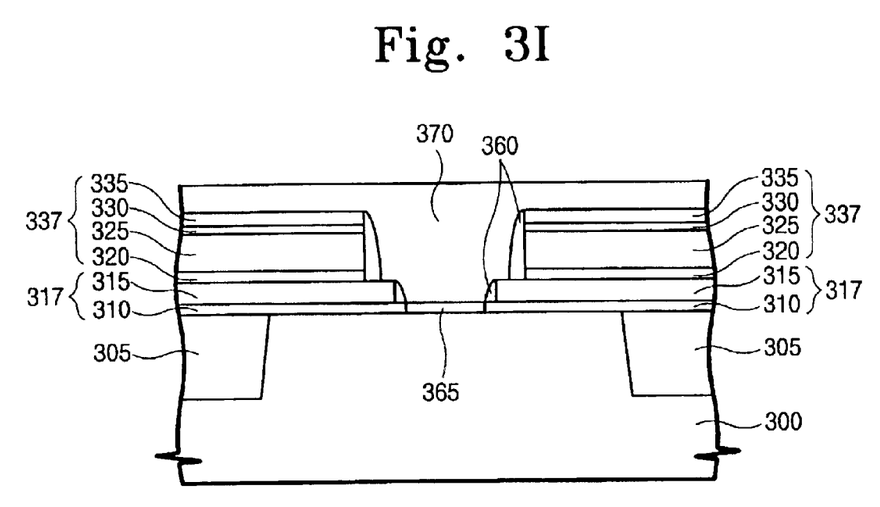

Referring to FIG. 3I, a gate conductive layer 370 is formed on the resultant structure having the gate insulation layer 365 at a depth that is enough to fill the stair-shaped opening 355. The gate conductive layer may be composed of at least one selected from the group consisting of polysilicon, silicon germanium, cobalt, tungsten, titanium, and nickel. The gate conductive layer may have a thickness, for example of 500 to 3000 Å.

Figure 3J:
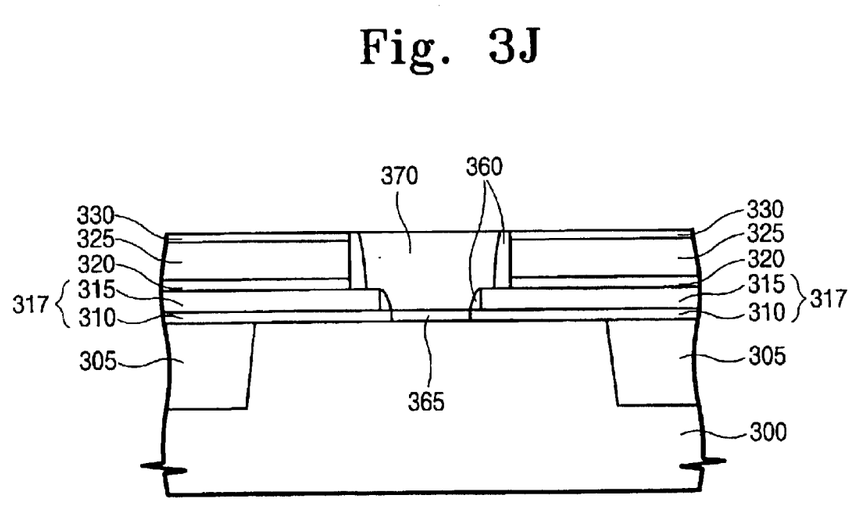

Referring to FIG. 3J, a CMP process is carried out into the gate conductive layer to form a gate electrode 370. The CMP is performed until the polishing stop layer 330 is exposed. In the present preferred embodiment, the height of the lower and upper insulation layers 315 and 325 may be adjusted to adjust the resulting height of the polishing stop layer 330. This enables the height of the gate electrode to be controlled.

Figure 3K:
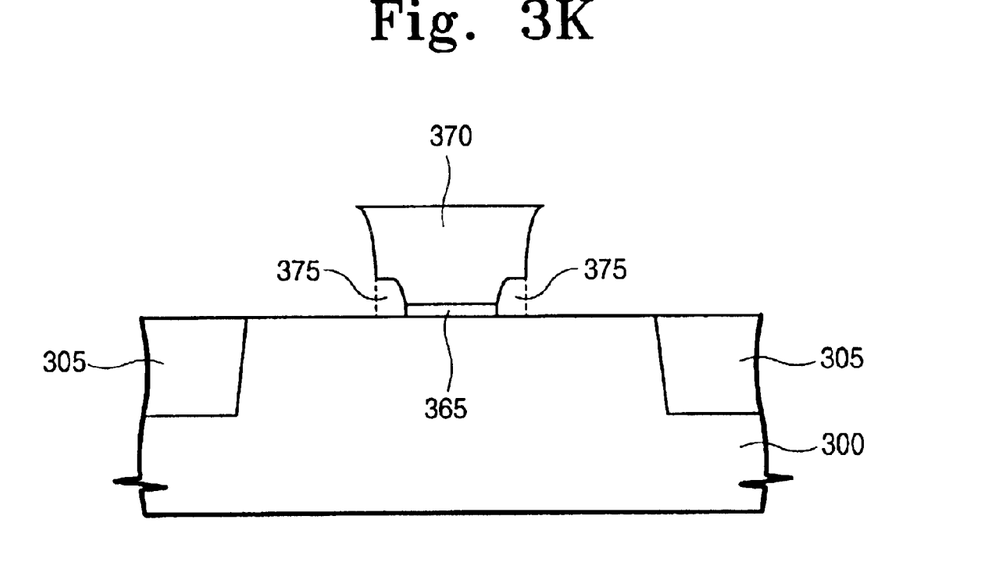

Referring to FIG. 3K, the polishing stop layer 330, the upper insulation layer 325, the etch stop layer 320, the lower insulation layer 315, and the sacrificial layer 310 are removed to form a notched gate 370. In this case, a portion of the insulation layer may be not etched and may therefore remain at the notch region 375 of the notched gate 370. In FIG. 3K, the insulation layer is illustrated as being completely removed in the notch region. It is preferable that the width and height of the notch region 375 range from 5 to 50% of the overall width and a height of the notched gate.

Figure 3L:
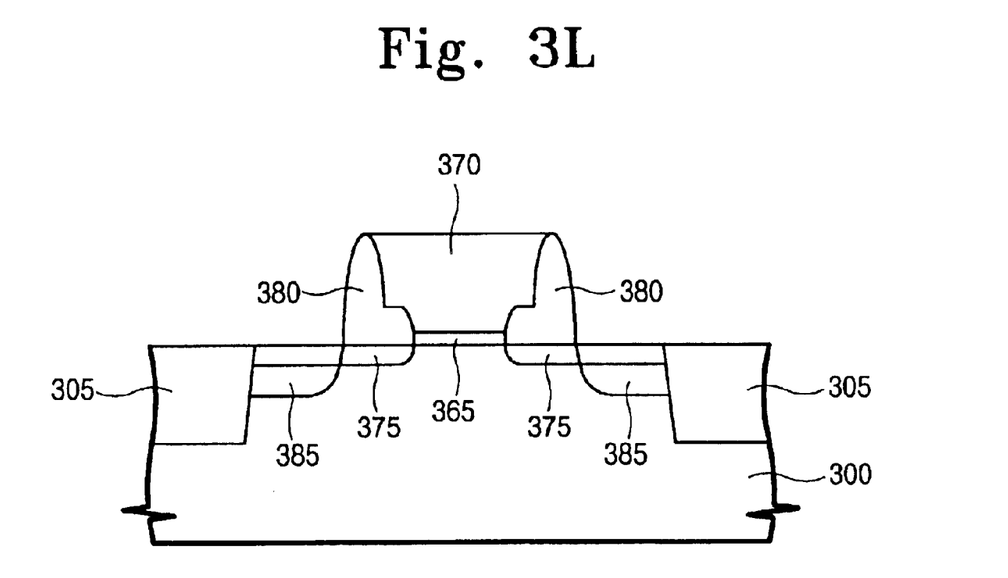

Referring to FIG. 3L, impurities are doped into the substrate 300 by using the notched gate electrode 370 as an ion implantation mask to form a lightly doped impurity region 375. A gate spacer insulation layer is formed on an entire surface of the substrate and an etchback process is performed into the resultant substrate to form a gate spacer 380.

Next, impurities are doped into the substrate by using the gate electrode 370 and the gate spacer 380 as an ion implantation mask to form a heavily doped impurity region 385. Consequently, fabrication of the MOS transistor is completed.

Embodiment 2

In a second preferred embodiment, unlike the first preferred embodiment, after forming an upper opening, a lower opening is formed by using a second mask pattern, rather than using the self-aligned spacer 345 shown above in FIG. 3D.

Figure 4A:
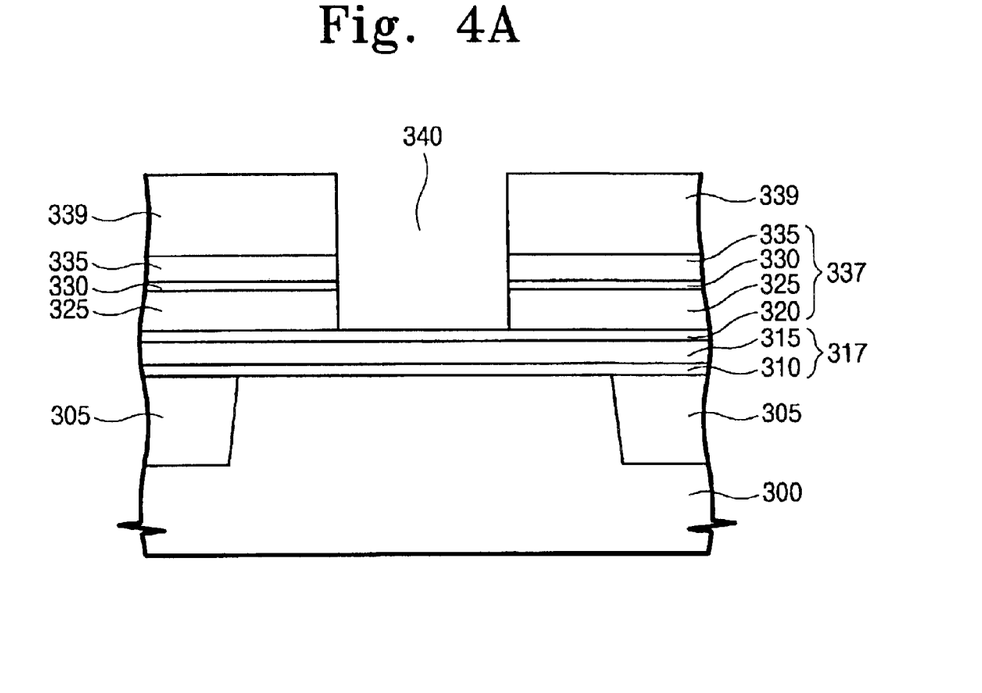
FIGS. 4A and 4B are cross-sectional views for illustrating a method for fabricating a MOS transistor according to a second preferred embodiment of the present invention.
Figure 4B:
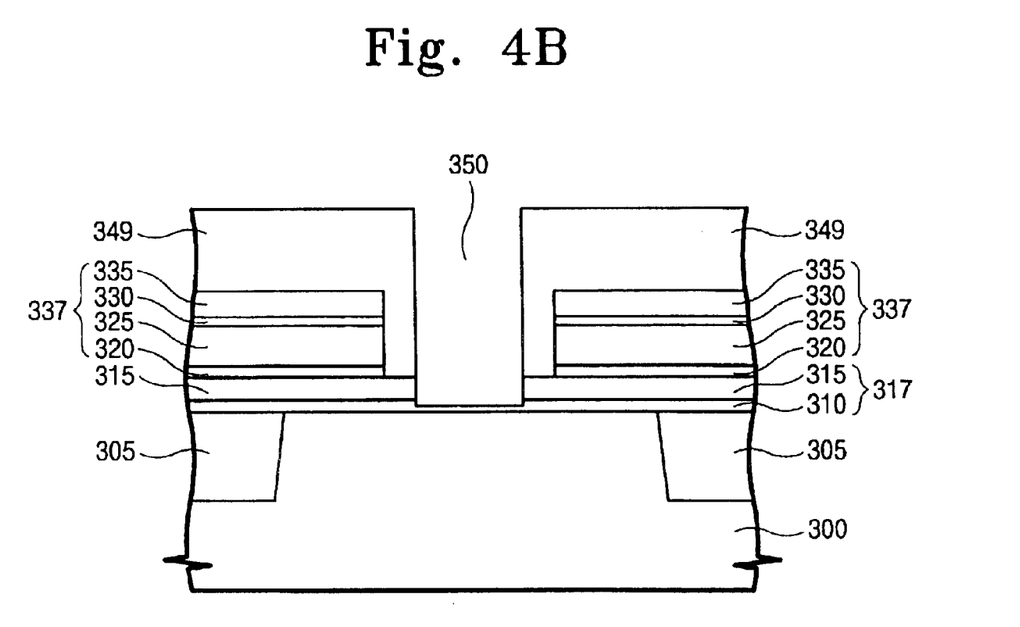

FIGS. 4A and 4B are cross-sectional views for illustrating a method for fabricating a MOS transistor with a notched gate electrode according to a second preferred embodiment of the present invention.

Referring to FIG. 4A, a device isolation layer 305 is formed at a substrate 300 to define an active region. Lower and upper molding layers 317 and 337 are then formed on the resultant substrate where the device isolation layer 305 is formed. The lower molding layer 317 may include a sacrificial insulation layer 310 and a lower insulation layer 315. The upper molding layer 337 may include an etch stop layer 320, an upper insulation layer 325, a polishing stop layer 330, and a capping insulation layer 335.

The upper molding layer 337 is patterned by using a first mask pattern 339, which is formed using photolithography, as an etch mask, thereby forming an upper opening 340 exposing a surface of the lower molding layer 317.

Referring to FIG. 4B, the first mask pattern 339 is removed, and a second mask pattern 349 is formed on the lower molding layer 317, which is exposed in the upper opening 340.

By using the second mask pattern 349 as an etch mask, the lower insulation layer 315 is etched to form a lower opening 350. Since the lower insulation layer 315 and the sacrificial insulation layer 310, both of which are oxide layers, do not have an etch selectivity with respect to each other, the etching time should be adjusted so as not to expose the substrate. In FIG. 4B, the sacrificial insulation layer 310 is illustrated as over-etched.

Thereafter, the second mask pattern is removed to obtain the resultant structure as illustrated above in FIG. 3E. The subsequent steps are the same as those of Embodiment 1. Description of those steps will be omitted here.

The invention may be embodied in different forms and should not be construed as limited to the embodiments set forth herein. Rather, these embodiments are provided so that this disclosure will be thorough and complete, and will fully convey the scope of the invention to those skilled in the art.

According to the present invention as described above, a notched gate electrode may be readily formed using a damascene process for filling a stair-shaped opening. In addition, since a dry etching process is not applied to form the notch region, the gate electrode may avoid becoming transformed and electric charged due to plasma.

In addition, the width of the self-aligned spacer may be adjusted to form the gate electrode at a desired width.

Finally, the respective thicknesses of the lower and upper insulation layers may be adjusted to form the gate electrode at a desired height.

What is claimed is:

1. A method for fabricating a MOS transistor, comprising:
    forming a multi-layered insulation layer, including at least two insulation layers, on a substrate;
    patterning the multi-layered insulation layer to form an opening exposing a predetermined region of the substrate, wherein the opening has a stair-shaped sidewall such that an upper portion of the opening is wider than a lower portion of the opening;
    forming a gate insulation layer on the exposed substrate;
    forming a gate electrode filling the opening on the gate insulation layer;
    removing the multi-layered insulation layer to form a gate electrode having a notch region under an edge portion thereof, the multi-layered insulation layer being removed from the notch region; and
    following removing the multi-layered insulation layer, forming source and drain regions in the substrate using the gate electrode having the notch region as an ion implantation mask.

2. The method as claimed in claim 1, wherein the multi-layered insulation layer includes lower and upper molding layers, which are sequentially stacked.

3. The method as claimed in claim 2, wherein the lower molding layer includes a sacrificial layer and a lower insulation layer, which are sequentially stacked.

4. The method as claimed in claim 3, wherein the sacrificial layer comprises a silicon oxide layer.

5. The method as claimed in claim 3, wherein the lower insulation layer comprises a silicon oxide layer formed to have a thickness ranging from 50 to 1000 §.

6. The method as claimed in claim 3, wherein forming the opening having the stair-shaped sidewall comprises:
    patterning the upper molding layer using a mask pattern to form an upper opening exposing the lower insulation layer;
    forming a self-aligned spacer on a side of the upper opening;
    etching the lower insulation layer using the self-aligned spacer as an etch mask to form a lower opening exposing the sacrificial layer; and
    removing the sacrificial layer using a cleaning process to expose a surface of the substrate.

7. The method as claimed in claim 6, wherein the self-aligned spacer comprises a silicon nitride layer formed to have a thickness ranging from 5 to 500 §.

8. The method as claimed in claim 3, wherein forming the opening having the stair-shaped sidewall comprises;
    patterning the upper molding layer using a first mask pattern to form an upper opening exposing a surface of the lower insulation layer;
    patterning the lower insulation layer using a second mask pattern to form a lower opening exposing a surface of the sacrificial insulation layer; and
    removing the sacrificial insulation layer using a cleaning process to expose a surface of the substrate.

9. The method as claimed in claim 2, wherein the upper molding layer includes an etch stop layer, an upper insulation layer, a polishing stop layer, and a capping insulation layer, which are sequentially stacked.

10. The method as claimed in claims 9, wherein the etch stop layer comprises a silicon nitride layer.

11. The method as claimed in claim 9, wherein the upper insulation layer comprises a silicon oxide layer formed to have a thickness ranging from 500 to 3000 Å.

12. The method as claimed in claim 9, wherein the polishing stop layer comprises a silicon nitride layer.

13. The method as claimed in claim 9, wherein the capping insulation layer comprises a silicon oxide layer.

14. The method as claimed in claim 9, wherein forming the opening having the stair-shaped sidewall comprises:
    patterning the capping insulation layer, the polishing stop layer, and the upper insulation layer using a mask pattern to form an upper opening exposing the etch stop layer;
    forming a spacer insulation layer on an entire surface of the substrate including the upper opening;
    etching back the spacer insulation layer until a surface of the lower molding layer is exposed such that a self-aligned spacer is formed; and
    etching the lower molding layer by using the self-aligned spacer as an etch mask to form a lower opening exposing a surface of the semiconductor substrate.

15. The method as claimed in claim 14, wherein the self-aligned spacer comprises a silicon nitride layer formed to have a thickness ranging from 5 to 500 §.

16. The method as claimed in claim 9, wherein forming the opening having the stair-shaped sidewall comprises:
    patterning the capping insulation layer, the polishing stop layer, and the upper insulation layer using a first mask pattern to form an upper opening exposing a surface of the etch stop layer; and
    patterning the etch stop layer and the lower molding layer using a second mask pattern to form a lower opening exposing a surface of the semiconductor substrate.

17. The method as claimed in claim 9, wherein forming the opening having the stair-shaped sidewall comprises:
    patterning the capping insulation layer, the polishing stop layer, and the upper insulation layer using a mask pattern to form an upper opening exposing the etch stop layer;
    forming a spacer insulation layer on an entire surface of the substrate including the upper opening;
    etching back the spacer insulation layer until a surface of the lower insulation layer is exposed such that a self-aligned spacer is formed;
    etching the lower insulation layer using the self-aligned spacer as an etch mask to form a lower opening exposing a surface of the sacrificial insulation layer; and
    removing the sacrificial insulation layer using a cleaning process to expose a surface of the substrate.

18. The method as claimed in claim 17, wherein the self-aligned spacer comprises a silicon nitride layer formed to have a thickness ranging from 5 to 500 §.

19. The method as claimed in claim 9, wherein forming the opening having the stair-shaped sidewall comprises:
    patterning the capping insulation layer, the polishing stop layer, and the upper insulation layer using a first mask pattern to form an upper opening exposing a surface of the etch stop layer;
    patterning the etch stop layer and the lower insulation layer using a second mask pattern to form a lower opening exposing a surface of the sacrificial insulation layer; and
    removing the sacrificial insulation layer using a cleaning process to expose a surface of the substrate.

20. The method as claimed in claim 2, wherein the lower molding layer includes a sacrificial layer and a lower insulation layer, and the upper molding layer includes an etch stop layer, an upper insulation layer, a polishing stop layer and a capping insulation layer.

21. The method as claimed in claim 2, wherein forming the opening having the stair-shaped sidewall comprises:
    patterning the upper molding layer using a mask pattern to form an upper opening exposing the lower molding layer;
    forming a self-aligned spacer on a side of the upper opening; and
    etching the lower molding layer using the self-aligned spacer as an etch mask to form a lower opening exposing a surface of the semiconductor substrate.

22. The method as claimed in claim 21, wherein the self-aligned spacer comprises a silicon nitride layer formed to have a thickness ranging from 5 to 500 §.

23. The method as claimed in claim 2, wherein forming the opening having the stair-shaped sidewall comprises:
    patterning the upper molding layer using a first mask pattern to form an upper opening exposing a surface of the lower molding layer; and patterning the lower molding layer using a second mask pattern to form a lower opening exposing a surface of the semiconductor substrate.

24. The method as claimed in claim 1, further comprising:
forming a protecting spacer insulation layer on an entire surface of the substrate including the opening with the stair-shaped sidewall; and
etching back the protecting spacer insulation layer to form a protecting spacer on a side of the stair-shaped opening.

25. The method as claimed in claim 1, wherein forming the gate electrode filling the opening on the gate insulation layer comprises:
forming a gate conductive layer that sufficiently fills the opening; and
planarizing the gate conductive layer using chemical mechanical polishing (CMP).

26. The method as claimed in claim 25, wherein the gate conductive layer is composed of at least one material selected from the group consisting of polysilicon, silicon germanium, cobalt, tungsten, titanium, and nickel.

27. The method as claimed in claim 1, wherein forming the source and drain regions comprises:
forming lightly doped impurity source and drain regions using the gate electrode having the notch region as an ion implantation mask;
forming a gate electrode spacers on sidewalls of the gate electrode having the notch region; and
forming heavily doped impurity regions using the gate electrode having the notch region and the gate electrode spacers as an ion implantation mask.

28. A method for fabricating a MOS transistor, comprising:
forming a multi-layered insulation layer including lower and upper molding layers which are sequentially stacked on a substrate, wherein the upper molding layer includes an etch stop layer, an upper insulation layer, a polishing stop layer, and a capping insulation layer, which are sequentially stacked;
patterning the multi-layered insulation layer to form an opening exposing a predetermined region of the substrate, wherein the opening has a stair-shaped sidewall such that an upper portion of the opening is wider than a lower portion of the opening;
forming a gate insulation layer on the exposed substrate;
forming a gate electrode filling the opening on the gate insulation layer; and
removing the multi-layered insulation layer to form a gate electrode having a notch region under an edge portion thereof.

29. The method as claimed in claim 28, wherein the lower molding layer includes a sacrificial layer and a lower insulation layer, which are sequentially stacked.

30. A method for fabricating a MOS transistor, comprising:
forming a multi-layered insulation layer including lower and upper molding layers which are sequentially stacked on a substrate;
patterning the multi-layered insulation layer to form an opening exposing a predetermined region of the substrate by:
patterning the upper molding layer using a mask pattern to form an upper opening exposing the lower molding layer;
forming a self-aligned spacer on a side of the upper opening; and
etching the lower molding layer using the self-aligned spacer as an etch mask to form a lower opening exposing a surface of the semiconductor substrate, wherein the opening has a stair-shaped sidewall such that an upper portion of the opening is wider than a lower portion of the opening;
forming a gate insulation layer on the exposed substrate;
forming a gate electrode filling the opening on the gate insulation layer; and
removing the multi-layered insulation layer to form a gate electrode having a notch region under an edge portion thereof.

* * * * *

UNITED STATES PATENT AND TRADEMARK OFFICE
CERTIFICATE OF CORRECTION

PATENT NO. : 6,812,111 B2
DATED : November 2, 2004
INVENTOR(S) : Kong-Soo Cheong et al.

It is certified that error appears in the above-identified patent and that said Letters Patent is hereby corrected as shown below:

Column 7,
Lines 13 and 28, delete "§" and insert -- Å --.

Column 8,
Lines 3, 32 and 62, delete "§" and insert -- Å --.

Signed and Sealed this

Fifteenth Day of February, 2005

JON W. DUDAS
*Director of the United States Patent and Trademark Office*